United States Patent
Kornblit et al.

(10) Patent No.: US 6,228,277 B1
(45) Date of Patent: May 8, 2001

(54) ETCH ENDPOINT DETECTION

(75) Inventors: Avinoam Kornblit, Highland Park, NJ (US); Tseng-Chung Lee, New York; Heon Lee, Fishkill, both of NY (US); Helen Louise Maynard, Menlo Park, CA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/172,456

(22) Filed: Oct. 14, 1998

(51) Int. Cl.[7] ............................. H01L 21/66; G01R 31/26
(52) U.S. Cl. ............................. 216/60; 216/59; 438/14; 438/16
(58) Field of Search ............................. 216/59, 60; 438/14, 438/16

(56) References Cited

U.S. PATENT DOCUMENTS

| | | | |
|---|---|---|---|
| 4,208,240 | * 6/1980 | Latos | 216/60 |
| 4,680,084 | 7/1987 | Helmann et al. | 156/626 |
| 5,465,154 | * 11/1995 | Levy | 356/382 |
| 5,494,697 | * 2/1996 | Blayo et al. | 427/10 |

* cited by examiner

*Primary Examiner*—Randy Gulakowski
*Assistant Examiner*—Shamim Ahmed
(74) *Attorney, Agent, or Firm*—Peter V. D. Wilde; Thomas, Kadyen, Horstemeyer & Risley LLP

(57) ABSTRACT

The specification describes an interferometric in-situ end point detection technique for plasma etching in which the end point is predicted before any overetching occurs. It is based on the recognition that the wavelength of the monitoring beam can be selected so that only a single interferometric fringe appears before clearing. Knowing there is only one fringe, detection is simplified and the etching process can be terminated while a finite but small thickness of the layer remains. This allows etching partial thicknesses of layers. It also allows a two step etch process wherein the etch chemistry can be changed to a highly selective etch to complete clearing of the layer.

14 Claims, 3 Drawing Sheets

ETCH ENDPOINT DETECTION

FIELD OF THE INVENTION

This invention relates to methods for etching layers using endpoint detection.

BACKGROUND OF THE INVENTION

Etch processes in state of the art semiconductor technology use endpoint detection techniques to avoid excessive overetching. These techniques have become more sophisticated as design rules shrink and greater control over etch parameters becomes necessary.

A widely used end point detection technique is to detect chemical changes in the etching environment. Monitoring the atmosphere in an etch reactor by spectroscopy reveals when one layer has cleared and another has begun to etch. However, when very precise control is required the detection of this endpoint actually occurs when overetching has already begun. Typically, the etch profile in a window near the termination of the etch step is "dished", with the center portion cleared but with material still remaining at the edge of the window. Normal practice is to overetch, to clear the entire window. This causes the underlying layer to be etched. While slight overetching has been acceptable in many prior art processes, new device structures may not tolerate overetching. For example, gate dielectrics in current ULSI technology may be tens of Angstroms. If a polysilicon gate is patterned over such a thin gate dielectric using prior art techniques, some portions thereof may be thinned excessively, or even cleared to the substrate.

The generic problem with chemical end point sensors is that they infer the layer dimensions. Non-destructive techniques for measuring the layer thickness directly, which can be used for in-situ monitoring, are preferred because the thickness of the layer being etched is not only directly measured, but the endpoint can be anticipated and stopped before clearing of the next layer begins. With this capability, a two step etch can be performed. In the first etch step an aggressive etch can be used. When onset of clearing is imminent, the etch chemistry can be switched to a highly selective etchant. In this way a squared etch profile can be produced with essentially no overetching. As is known, etch selectivity is defined as the ratio of the rate of etching of said layer being etched to the rate of etching of the layer underneath the layer being etched. A highly selective etch in state of the art plasma processing can be defined as an etch with a selectivity of greater than 40:1.

Optical end point detection techniques have been proposed which measure layer thicknesses directly. For example, polarization ellipsometry is a very sensitive end point detection technique. See U.S. Pat. No. 5,494,697, issued Feb. 27, 1996. While this technique is effective, it is complex and requires expensive tools.

Interferometric end point detection schemes have also been proposed. These rely on the detection of optical fringes from a reflected light beam. The pattern of fringes changes as the layer thickness changes. The fringes cease when the layer thickness is zero. However, here again the end point cannot be anticipated, and precise end point detection is difficult to realize. As in the case of chemical end point detection, prior art interferometric detection schemes also produce some degree of overetching.

Improved endpoint detection techniques are continually sought which provide sensitive and direct thickness measurements, are compatible with dry etch processes, and can be implemented as in-situ monitoring tools.

SUMMARY OF THE INVENTION

We have developed a dry etch process which uses optical endpoint detection based on interferometry, and in which the endpoint can be predicted. The imminence of the end point is signaled as a change in reflectivity. The change is essentially a single fringe that appears just before the onset of clearing. Detection of this fringe allows the operator to anticipate the end point, and, if desired, to implement the two step process described above. We have discovered that the wavelength of the monitoring light beam can be selected so as to produce only a single fringe prior to clearing.

DETAILED DESCRIPTION

Figure 1:
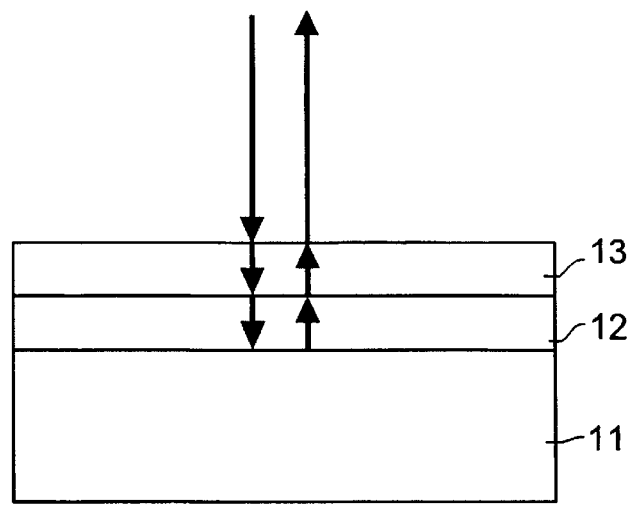
FIG. 1 is a schematic diagram an interferometric technique for monitoring the thickness of a layer being etched.

With reference to FIG. 1, substrate 11 is shown with a first layer 12 on the substrate, and a second layer 13 on the first layer 12. In silicon technology, the substrate 11 is silicon, and the layer 12 is $SiO_2$. Layer 12 is the grown field oxide layer. The gate dielectric is the same as this layer in principle but is much thinner. Layer 13 is typically the gate layer and may be polysilicon or amorphous silicon. Polysilicon has been used widely for silicon MOS gates, but as dimensions continue to shrink, and the thickness of the gate layer and the gate dielectric layer shrink, the potential for unwanted doping of the channel in the substrate under these layers increases. The silicon crystals in polysilicon films may allow channeling of ion implanted impurities, so that the tail of the implant may extend into the channel. To avoid this it is becoming common to use amorphous silicon, which contains the implanted ions in a tighter spread. When the term polysilicon is used in this description, it should be understood to include the alternative use of amorphous silicon. In some instances, there may be an additional layer, such as a metal silicide (Ta, W, etc.) or titanium nitride over the polysilicon to increase conductivity.

In general, an etch process performed on a layer over a very thin layer, e.g. less than 50 Angstroms, is more likely to be susceptible to the process control problems outlined earlier. The layer combination just described is in that category, and the etch process used with this combination is among the most critical in a typical semiconductor process. However, etching of layers in subsequent steps in silicon processing, or etch steps used in the processing of other semiconductor devices may also use these techniques. For example, metal layers used for interconnections in semiconductor devices are also shrinking in size, and the etching of these layers presents considerations similar to those outlined above. Materials used in these layers include aluminum (or a TiN/Al/TiN stack), the metal of choice for interconnection, multilayer interconnect materials such as Ti-Pd-Au, contact pad metallization such as chromium and chromium-copper, window plugs of tungsten, tantalum, tantalum nitride, titanium nitride, etc. Other semiconductor materials of interest are III–V materials such as InP, InGaAs, InGaAsP. These are used most widely in photonic devices such as lasers and modulators, and in high frequency transistors. In the technology of III–V materials, the semiconductor layers themselves are typically etched to isolate mesa structures for individual devices. In planar silicon technology, by way of contrast, the materials usually etched are metals or polysilicon.

The monitoring beam in FIG. 1 is incident on the top layer 13 as shown. The return beam is reflected from the interface between layer 12 and layer 13, and the interface between layer 12 and substrate 11. The incident beam and the return beam will interfere constructively or destructively, as is well known in the art, depending on the transit length of the beam through the layer. This produces an interference pattern, or fringe pattern, that is dependent on the thickness of the layer. The light source may be a laser, an infra red lamp, or may be the inherent glow of the plasma. The wavelength of the light is typically in the red region of the spectrum, i.e. around 6000 Angstroms. The detector is typically a photodiode, e.g. GaAs, sensitive to this wavelength. The monitoring beam is shown at normal incidence for convenience but, as is well known in the art, the beam can be at any angle.

Figure 2:
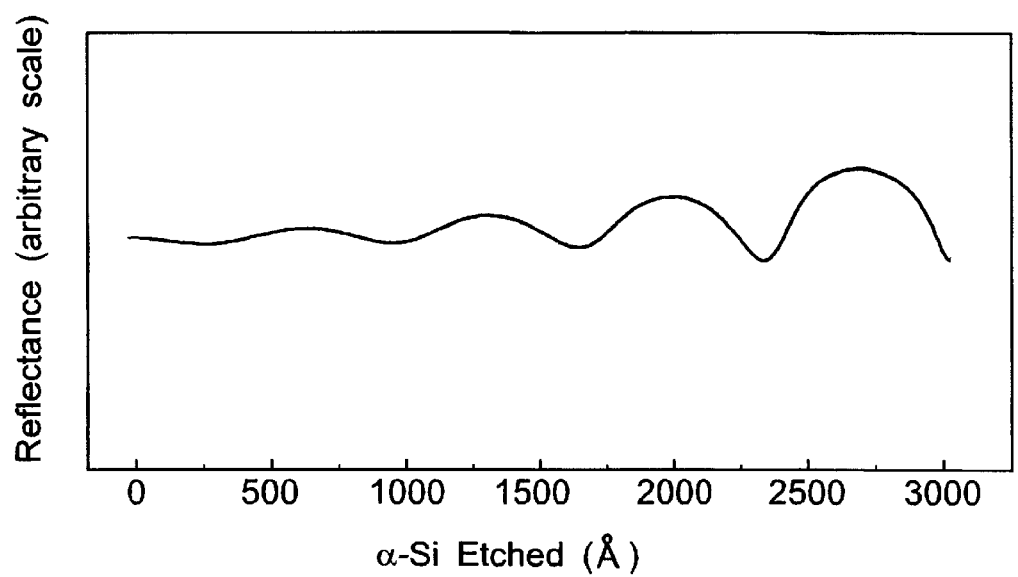
FIG. 2 is a plot of reflectance vs. thickness of the layer being etched showing the interference pattern characteristic of prior art interferometric end point detection techniques.
Figure 3:
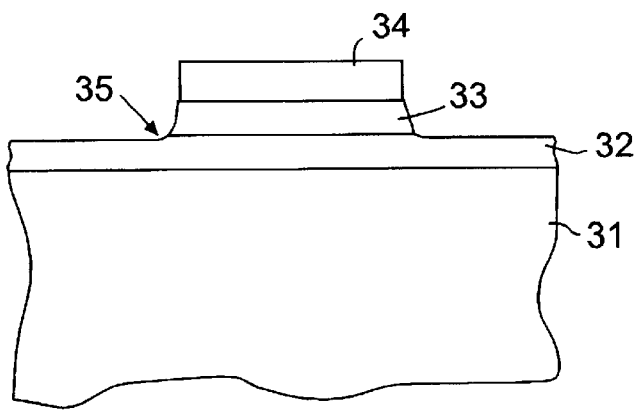
FIG. 3 shows a typical etch profile for an etch process of the prior art.

The most straightforward use of this phenomenon in end point detection is to monitor the layer thickness in an in-situ mode, and to terminate etching when the fringe pattern disappears. This is illustrated in FIG. 2, where the curve relates reflectance of the monitoring beam as a function of the thickness of the layer being etched. A 3000 Angstrom layer of amorphous silicon on a 3000 Angstrom layer of $SiO_2$ was used for the demonstrations described here. These thicknesses are typical for the gate level polysilicon over the field oxide. The wavelength used for the monitoring beam was $\lambda$=6000 Angstroms. The fringe pattern shows fringes occurring throughout the etch process until, at the clearing point, i.e. $\alpha$-Si etched=3000 Angstroms, reflectance stabilizes and no further fringes appear. The disappearance of fringes signals the end point. However at this point overetching begins, as described above, and a significant amount of overetching (significant in terms of the fraction of a very thin layer removed) occurs before etching can be effectively terminated. Moreover, the etchant typically used for this step is relatively rapid and aggressive, and the etch profile in a typical window shows the dish shape shown in FIG. 3. In FIG. 3 the silicon substrate is shown at 31, the $SiO_2$ layer at 32, the $\alpha$-Si layer at 33, and a photoresist layer at 34. The dishing, or overetching resulting in erosion of the underlayer 32 is designated by arrow 35.

The lithographic mask layer 34 used for these demonstrations was a conventional photoresist. However, the lithography technique can alternatively use an e-beam or x-ray exposure tool and mask, and the terms lithography and lithographic are intended to cover these alternatives.

It should be evident from FIG. 2 that the interferometric technique of the prior art relies on the observance of fringes. Therefore it is desirable to have many distinct fringes in the reflected signal. It is also assumed that the monitoring beam should have a wavelength which transmits efficiently through the layer being etched, i.e. above 5500 Angstroms for $\alpha$-Si or polysilicon.

The technique of the invention departs from conventional techniques in using a wavelength for the monitoring light beam to which the layer being etched is largely opaque. In this case there are no interference fringes in the return beam until the layer becomes very thin. If the wavelength is optimized using the principle of the invention, a single interference fringe will be observed just before clearing begins. Since it is known that this last fringe is the only fringe produced during the etching process, the last fringe can be used to signal imminent clearing. The thickness of the layer at this point is small enough to allow the beam to transmit to the underlayer thus producing the fringe, but still thick enough for the process to be terminated before any overetching begins.

To operate in the regime just described, i.e. where the wavelength of the monitoring beam is substantially absorbed in the layer being monitored, it will normally be the case that the linear absorption of the monitoring beam in the film being monitored will be greater than 30% per 100 Angstroms.

Figure 4:
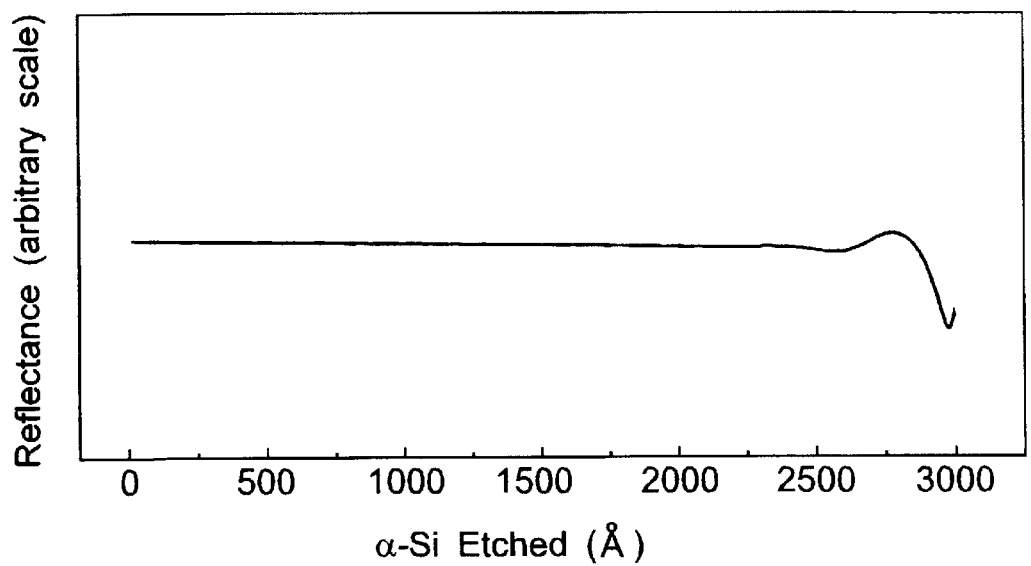
FIG. 4 is a plot of reflectance vs. thickness of the layer being etched illustrating the result of selecting the wavelength for the monitoring beam according to the invention.

Reflectance vs. thickness of a monitoring beam according to the invention is shown in FIG. 4. The wavelength, $\lambda$, of the monitoring beam is 4000 Angstroms. The reflectance shows a steady state throughout most of the etch process until the thickness of the layer being etched reaches approximately 500 Angstroms, when the first and only fringe begins to appear. This fringe can be calibrated if desired to trigger termination of the etch process at any convenient point. For example, etching can be terminated when the reflectance reaches a maximum (point of inflection) of the fringe, i.e. approximately 400 Angstroms, or at the point where the reflectance passes through the steady state value, i.e. approximately 250 Angstroms. It can be terminated when the inflection reaches minimum, i.e. a few tens of angstroms. As a general proposition, and to define the invention, the detection step involves detecting a significant change in reflectivity of the monitoring beam, and an etch step is terminated in response to that detection There may or may not be subsequent etch steps as will be described below. To avoid false response to small or spurious changes in the steady state reflectivity prior to the first and last fringe, a change in reflectivity of at least 5%, and preferably 30% can be assumed reliably to signal the occurrence of the last fringe.

Figure 5:
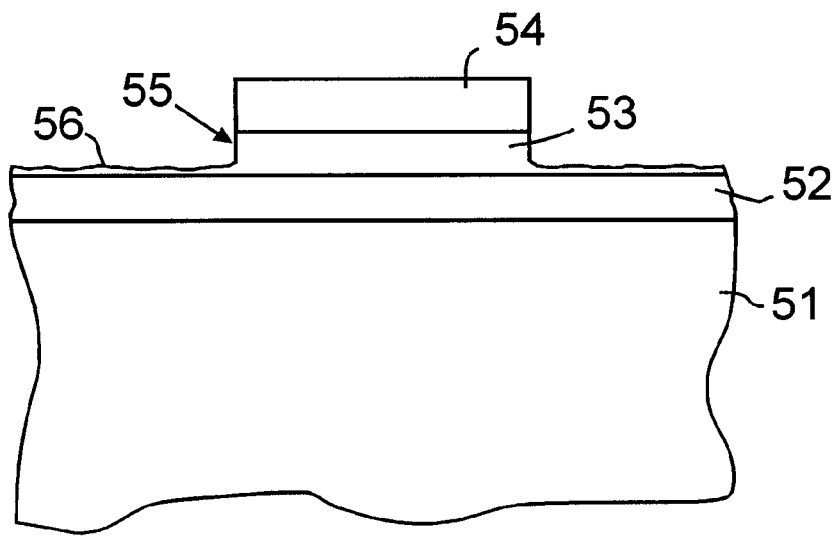
FIGS. 5 and 6 characterize the etch process of the invention.
Figure 6:
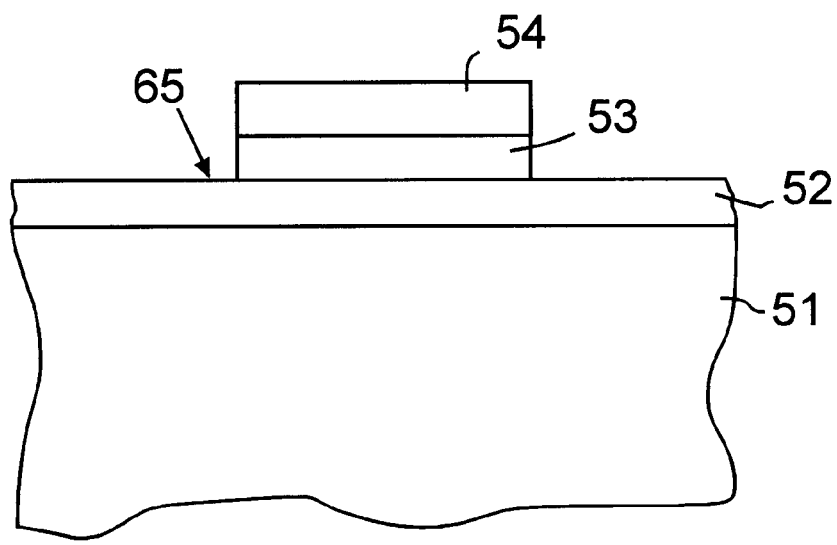

A significant advantage of the technique of the invention is that it anticipates clearing at a point where it is practical and effective to switch plasma etch chemistries. Thus using the technique of the invention the two step etch process described earlier can be implemented. The main etch, i.e. the first step, can be performed using an aggressive etch, or preferably an etch that provides good profile control. In the typical case, that is a highly anisotropic etch. Some etch chemistries that produce optimum profiles are less selective than is desirable. When such etchants are used in the technique described in conjunction with FIGS. 2 and 3, an undesirable compromise exists between sidewall profile and the degree of dishing due to the overetch. Using the technique of the invention, the main etch step, i.e. the step that produces the bulk of the profile, can be conducted with a relatively non-selective etch, and this etch step terminated well before overetch. Step two uses a highly selective etch chemistry to complete clearing of the layer. This two step technique is described by FIGS. 5 and 6. Referring to FIG. 5, substrate 51 is covered with $SiO_2$ layer 52 as before, and undoped (or lightly doped) $\alpha$-Si layer 53 is shown after completion of the first etch step. The etch was conducted in a Lam 9400 SE plasma etcher using 150 mm wafers. The etchant and flow rates were: 30 sccm $Cl_2$, 150 sccm HBr, and the pressure was 10 mTorr. The source power was 250 W and the bias power was 180W. This etch chemistry produces good sidewall profiles, as indicated at 55 in FIG. 5, but the etch is only moderately selective (approximately 20:1).

The etch profile of layer 53 after the first etch step is shown schematically in the figure. The features are exaggerated for illustration. The sidewalls 55 are steep and vertical. The profile of the layer surface is typically slightly irregular, as represented at 56. When etching proceeds at this point in the conventional process, the irregularities cause some portions of the layer, typically portions near the center of a window or stripe, to clear before other portions, typically edge portions. Clearing the entire layer requires some degree of etching of layer 52. According to the invention, etching is terminated at the onset of, or slightly after, the appearance of the first and final interference fringe. This leaves a thin but continuous layer as shown in FIG. 5. Final clearing of this layer is achieved using a highly selective etch (greater than 40:1 and preferably greater than 100:1). An effective etch chemistry for this step is HBr and $O_2$. Appropriate flow rates are 100 sccm HBr, 10 sccm He—$O_2$ (20% $O_2$), 200 sccm He. Pressure is approximately 80 mTorr and the power levels are: source: 300 W, bias: 200 W. This etch process is suitable also for undoped or lightly doped polysilicon. Slight variations, within the skill of the art, may be made for more heavily doped material.

As is well known, the etch parameters just given are suitable for the particular plasma etch apparatus used, and may vary somewhat with other dry etch equipment. These processes are very well established in the art, and the details of the dry etch chemistry and etch parameters are not directly part of the invention.

An advantage of the end point detection technique of this invention is that the return beam can be sensed with a monochromatic detector. This makes the tool simpler than with spectrographic tools, where multiple wavelengths are detected. The monitoring beam may also be monochromatic but conveniently is a broader band source such as a xenon lamp. The monitoring beam may be incident on the substrate being monitored using an optical fiber, and the return beam may also be sensed with an optical fiber connected to a sensitive photodiode. For the wavelengths of interest in silicon processing, the source is preferably a xenon lamp or a mercury lamp, and the detector is a photodiode array of Si photodiodes, a monochromator set at the desired wavelength. or the combination of a filter and a single Si photodiode.

The etch step is described above as a two step process, which is the preferred approach, but the advantages of the invention can also be realized using a single etch step. In this case either of the etch procedures described can be used effectively.

The technique of the invention can also be used to etch controllably through part of the thickness of a layer. This capability has been recognized for some time as an obviously useful tool in semiconductor device processing. Most past attempts to do this have relied on timed etch sequences, which are difficult or impractical to control. As described in detail above, the etch process of the invention can be used to stop the etch step with a thin layer remaining. This layer may constitute an element of a device, or may be used as a processing tool in some applications. For example, ion implant regions with varying implant depths can be made either in a single step through a layer that is selectively thinned, or by using multiple implants through a layer that is sequentially thinned. In the fabrication of InP based transistors and lasers there are process steps in which etching only partly through the thickness of a III-V semiconductor layer is desired.

For end point detection according to the invention in a polysilicon or amorphous silicon etch process, the wavelength of the monitoring beam should be in the range 3000–5000 Angstroms depending on the sensitivity desired, and preferably in the range 3500–4500 Angstroms. The proper wavelength can be determined for a given material using the following approach. The complex refractive index of the material is given as:

$$\eta = n - ik$$

where n and k are the real and imaginary part of the refractive index, respectively. The values for n and k can be measured experimentally or taken from known technical literature.

The wavelength for the monitoring beam can be chosen by one of two methods.

1. Choose a wavelength corresponding to an arbitrarily large value of k, e.g. 2. For most materials, this information is readily available in the literature. See e.g. "Handbook of Optical Constants of Solids," E. H. Palik, Editor (Acedemic, 1985). In the case of amorphous silicon or polysilicon (as deposited or annealed), k=2 will correspond roughly to $\lambda$=370 nm. Using this as a starting point, if more than one fringe is observed, shorter wavelengths should be used. The final $\lambda$ will be influenced not only by the presence of a single fringe but also light intensity, detector gain, and sensitivity to polymer formation in the window (which is more pronounced at shorter wavelengths) can be used as second order indicators. In the case of $\alpha$-Si, k=2 corresponds to a $\lambda$ of 4100 Angstroms and 3700 Angstroms for as-deposited $\alpha$-Si, and annealed $\alpha$-Si, respectively. Polysilicon behaves similarly to annealed $\alpha$-Si.

2. Since the absorption depends on both n and k, an exact calculation can be made of the monitoring beam wavelength. The ratio of the amplitude of the last fringe relative to the previous fringe (starting with a relatively long wavelength) is calculated after subtracting the baseline. The amplitude ratio can be defined as:

$$R = (A_L - B)/(A_p - B)$$

where R is the reflectance in arbitrary units, B is the baseline reflectance, $A_L - B$ is the reflectance at the height of the last peak, and $A_p - B$ is the reflectance at the height of the fringe previous to the last peak. Using this approach R as a function of $\alpha$ can be derived. If the ratio R is very large, e.g. greater than 5, the last fringe can be easily detected and, from experience gathered with these data, can be assumed to be the last fringe.

Both of these methods for determining the wavelength of the monitoring beam, and the overall etching process, can be used with materials other than Si, and can be used with any number of layers beneath the layer being etched. The etch process of the invention may also be performed on a single layer on a substrate, which would be recognized by those skilled in the art as an equivalent to etching a layer upon another layer.

In the foregoing process description the etch processes used were plasma etch processes. The invention is applicable to any dry etch technique, including ion beam etching.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A process for etching a layer upon another layer comprising the steps of:
   a. mounting a substrate in an etching apparatus, said substrate having a substrate surface, and at least a first layer on the substrate surface the first layer having a top surface and a bottom surface in contact with the substrate,
   b. sealing the apparatus,
   c. etching said layer,
   d. directing an incident light beam onto the top surface of said first layer to create a reflected beam from the top surface of the first layer and the surface of the substrate, said incident light beam having a linear absorption in said first layer of greater than 30% per 100 Angstroms,
   e. monitoring the intensity of the reflected beam from the surface of the first layer and the surface of the substrate over time while said etching proceeds,
   f. detecting a single change in the intensity of the reflected beam, while some of said first layer remains and
   g. changing step c in response to step f.

2. The process of claim 1 wherein the step of etching comprises plasma etching.

3. The process of claim 2 wherein step g. is carried out by turning off said plasma.

4. The process of claim 2 wherein said etching is carried out using a first etch plasma, and step g. is carried out by changing the first etch plasma to a second etch plasma.

5. The process of claim 1 wherein the change in the intensity of the light reflected from said surface is at least 5%.

6. The process of claim 1 wherein the change in the intensity of the light reflected from said surface is at least 30%.

7. The process of claim 1 wherein the substrate is silicon.

8. The process of claim 7 wherein the silicon substrate is covered with a first layer and a second layer, and said first layer comprises $SiO_2$.

9. The process of claim 8 wherein said second layer comprises polysilicon.

10. The process of claim 8 wherein said second layer comprises amorphous silicon.

11. The process of claim 7 wherein said light beam has a wavelength in the range 3500–4500 Angstroms.

12. The process of claim 8 wherein said first layer has a thickness of less than 50 Angstroms.

13. The process of claim 4 wherein the first plasma has an etch selectivity lower than the etch selectivity of the second plasma.

14. The process of claim 13 wherein the second plasma has an etch selectivity of greater than 40:1.

* * * * *